United States Patent
Herle et al.

(10) Patent No.: US 11,180,849 B2
(45) Date of Patent: Nov. 23, 2021

(54) DIRECT LIQUID INJECTION SYSTEM FOR THIN FILM DEPOSITION

(71) Applicant: Applied Materials, Inc., Santa Clara, CA (US)

(72) Inventors: Subramanya P. Herle, Mountain View, CA (US); Vicente M. Lim, Newark, CA (US); Basavaraj Pattanshetty, Bangalore (IN); Ajay More, Bangalore (IN); Marco Mohr, Ortenberg (DE); Bjoern Sticksel-Weis, Alzenau (DE); Nilesh Chimanrao Bagul, Bangalore (IN); Visweswaren Sivaramakrishnan, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 148 days.

(21) Appl. No.: 16/546,170

(22) Filed: Aug. 20, 2019

(65) Prior Publication Data

US 2020/0071820 A1 Mar. 5, 2020

(51) Int. Cl.
C23C 16/455 (2006.01)
C23C 16/448 (2006.01)
(Continued)

(52) U.S. Cl.
CPC .......... *C23C 16/448* (2013.01); *C23C 14/081* (2013.01); *C23C 14/243* (2013.01);
(Continued)

(58) Field of Classification Search
CPC ............ C23C 16/448; C23C 16/45563; C23C 16/45578; C23C 14/243; C23C 14/24
See application file for complete search history.

(56) References Cited

U.S. PATENT DOCUMENTS 6,491,978 B1* 12/2002 Kalyanam ............... C23C 16/18
257/E21.17
7,975,718 B2   7/2011 Ngo et al.
(Continued)

FOREIGN PATENT DOCUMENTS

EP         3173507 A1    5/2017
KR  10-2012-0030658 A    3/2012
(Continued)

OTHER PUBLICATIONS

Vervaele, Mattias, et al., "Development of a new direct liquid injection system for nanoparticle deposition by chemical vapor deposition using nanoparticle solutions". Review of Scientific Instruments 87, 025101 (2016), pp. 1-8, https://doi.org/10.1063/1.4940937.*

(Continued)

*Primary Examiner* — Bret P Chen
(74) *Attorney, Agent, or Firm* — Patterson + Sheridan, LLP

(57) ABSTRACT

An apparatus for direct liquid injection (DLI) of chemical precursors into a processing chamber is provided. The apparatus includes a vaporizer assembly having an injection valve for receiving a liquid reactant, vaporizing the liquid reactant, and delivering the vaporized liquid reactant. The injection valve includes a valve body encompassing an interior region therein, a gas inlet port, a liquid inlet port, and a vapor outlet port all in fluid communication with the interior region. The vaporizer assembly further includes a first inlet line having a first end fluidly coupled with the liquid inlet port and a second end to be connected to a liquid source. The vaporizer assembly further includes a second inlet line with a first end fluidly coupled with the gas inlet port, a second end fluidly coupled with a carrier gas source, (Continued)

and a heater positioned between the first end and the second end.

12 Claims, 5 Drawing Sheets

(51) Int. Cl.
    *C23C 14/24*     (2006.01)
    *C23C 16/50*     (2006.01)
    *C23C 14/08*     (2006.01)

(52) U.S. Cl.
    CPC .. *C23C 16/45525* (2013.01); *C23C 16/45563* (2013.01); *C23C 16/45578* (2013.01); *C23C 16/50* (2013.01)

(56) References Cited

U.S. PATENT DOCUMENTS

| | | | |
|---|---|---|---|
| 8,129,271 | B2 | 3/2012 | Kojima et al. |
| 8,343,591 | B2 * | 1/2013 | Neal et al. |
| 2003/0049933 | A1 * | 3/2003 | Lei ............... B67D 7/0272 438/680 |
| 2004/0163590 | A1 * | 8/2004 | Tran ..................... C23C 16/44 118/715 |
| 2005/0045099 | A1 * | 3/2005 | Bencher ............ C23C 16/0245 118/715 |
| 2005/0250348 | A1 * | 11/2005 | Xia ................ H01L 21/02216 438/788 |
| 2007/0254093 | A1 | 11/2007 | Nijhawan et al. |
| 2007/0254100 | A1 | 11/2007 | Nijhawan et al. |
| 2008/0119058 | A1 * | 5/2008 | Ho .................. H01L 21/31695 438/780 |
| 2008/0251137 | A1 * | 10/2008 | Ngo ....................... C23C 16/52 137/486 |
| 2009/0203222 | A1 * | 8/2009 | Dussarrat .......... H01L 21/02189 438/778 |
| 2010/0075067 | A1 * | 3/2010 | Kim ..................... C23C 16/409 427/576 |
| 2010/0143607 | A1 * | 6/2010 | Lei ......................... C23C 16/18 427/569 |
| 2011/0298099 | A1 * | 12/2011 | Lee ..................... H01L 21/0332 257/632 |
| 2013/0019960 | A1 | 1/2013 | Choi et al. |
| 2018/0163307 | A1 | 6/2018 | Carlson |

FOREIGN PATENT DOCUMENTS

| | | |
|---|---|---|
| KR | 10-2018-0089515 A | 8/2018 |
| WO | WO 2004/010463 A2 * | 1/2004 |
| WO | 2018/024313 A1 | 2/2018 |

OTHER PUBLICATIONS

McCreary, Kathleen M., et al., "Synthesis of High-Quality Monolayer MoS2 by Direct Liquid Injection". ACS Appl. Mater. Interfaces, 2020, 12, 9580-9588.*

Heuken, M., et al., "Atomic Vapor Deposition and Atomic Layer Deposition of High-k and Electrode Materials". 217th ECS Meeting, 2010, Abstr. MA2010-01 929, 1 page. Abstract Only.*

Astie, Vincent, et al., "Direct Liquid Injection Chemical Vapor Deposition" (2019), pp. 1-23. 10.5772/intechopen.80244.*

International Search Report and Written Opinion for International Application No. PCT/US2019/047331 dated Dec. 4, 2019.

* cited by examiner

DIRECT LIQUID INJECTION SYSTEM FOR THIN FILM DEPOSITION

CROSS-REFERENCE TO RELATED APPLICATIONS

This application claims benefit of India Provisional Application No. 201841032971, filed Sep. 3, 2018, which is herein incorporated by reference in its entirety.

BACKGROUND

Field

Implementations described herein generally relate to methods and systems for the deposition of thin films at low temperatures. More particularly, the implementations described herein relate to methods and systems for the deposition of thin films on plastic substrates at low temperatures.

Description of the Related Art

Fast-charging, high-capacity energy storage devices, such as capacitors and lithium-ion (Li-ion) batteries, are used in a growing number of applications, including portable electronics, medical, transportation, grid-connected large energy storage, renewable energy storage, and uninterruptible power supply (UPS).

Li-ion batteries typically include an anode electrode, a cathode electrode, and a separator positioned between the anode electrode and the cathode electrode. The separator is an electronic insulator, which provides physical and electrical separation between the cathode and the anode electrodes. During electrochemical reactions, for example, charging and discharging, lithium ions are transported through pores in the separator between the two electrodes via an electrolyte.

High temperature melt integrity of battery separators is a key property to ensure safety of the battery. In case of internal heat build-up due to overcharging or internal short-circuiting, or any other event that leads to an increase of the internal cell temperature, high temperature melt integrity can provide an extra margin of safety, as the separator will maintain its integrity and prevent the electrodes from contacting one another at high temperatures.

Typical separators for lithium-ion batteries are based on polymers such as polyethylene (PE) and polypropylene (PP), which are produced via melt processing techniques. These types of separators typically have poor melt integrity at high temperatures (e.g., greater than 160 degrees Celsius). This poor melt integrity also limits the type of subsequent processing that the separator can endure.

Accordingly, there is a need in the art for methods and systems, which enable subsequent processing of separators while maintaining the melt integrity of the separator.

SUMMARY

Implementations described herein generally relate to methods and systems for the deposition of thin films at low temperatures. More particularly, the implementations described herein relate to methods and systems for the deposition of thin films on substrates at low temperatures. In one implementation, a direct liquid injection (DLI) system is provided. The DLI system is a liquid precursor source vaporization system, which vaporizes liquid stably and efficiently. In one implementation, the DLI system is a closed loop integrated system. The DLI System includes an injection valve, a Liquid Flow Meter (LFM), an ampoule assembly as a source of pressurized precursor, an inert push gas to pressurize the precursor in the ampoule assembly, a temperature controller to maintain a targeted temperature regime, and controlled carrier gas flow to a gas heater.

In another implementation, an apparatus for delivering a liquid reactant is provided. The apparatus comprises a vaporizer assembly for vaporizing a liquid reactant and flowing the vaporized reactant to a processing chamber. The vaporizer assembly comprises an injection valve for receiving the liquid reactant, vaporizing the liquid reactant, and delivering the vaporized liquid reactant. The injection valve comprises a valve body encompassing an interior region therein, a gas inlet port in fluid communication with the interior region, a liquid inlet port in fluid communication with the interior region, and a vapor outlet port in fluid communication with the interior region. The vaporizer assembly further comprises a first inlet line. The first inlet line comprises a first end fluidly coupled with the liquid inlet port and a second end to be connected to a liquid source. The vaporizer assembly further comprises a second inlet line. The second inlet line comprises a first end fluidly coupled with the gas inlet port, a second end fluidly coupled with a carrier gas source and a heater positioned between the first end and the second end.

In yet another implementation a system is provided. The system comprises a processing chamber and a direct liquid injection system for delivering a vaporized precursor to the processing chamber. The direct liquid infection system comprises a vaporizer assembly for vaporizing a liquid reactant and flowing the vaporized reactant to the processing chamber. The vaporizer assembly comprises an injection valve for receiving the liquid reactant, vaporizing the liquid reactant, and delivering the vaporized liquid reactant. The injection valve comprises a valve body encompassing an interior region therein, a gas inlet port in fluid communication with the interior region, a liquid inlet port in fluid communication with the interior region, and a vapor outlet port in fluid communication with the interior region. The vaporizer assembly further comprises a first inlet line. The first inlet line comprises a first end fluidly coupled with the liquid inlet port and a second end to be connected to a liquid source. The vaporizer assembly further comprises a second inlet line. The second inlet line comprises a first end fluidly coupled with the gas inlet port, a second end fluidly coupled with a carrier gas source and a heater positioned between the first end and the second end.

In yet another implementation, a method of forming a film is provided. The method comprises delivering a push gas from a push gas source to an ampoule assembly containing a liquid precursor to pressurize the liquid precursor. The method further comprises delivering the pressurized liquid precursor to a vaporizer. The method further comprises vaporizing the liquid precursor in the vaporizer to form a vaporized reactant. The method further comprises delivering the vaporized reactant to a processing region in a processing chamber. The method further comprises reacting the vaporized reactant with an evaporated precursor and/or plasma to deposit a ceramic-containing layer on a substrate positioned in the processing region.

BRIEF DESCRIPTION OF THE DRAWINGS

So that the manner in which the above-recited features of the present disclosure can be understood in detail, a more particular description of the implementations, briefly sum

Figure 1:
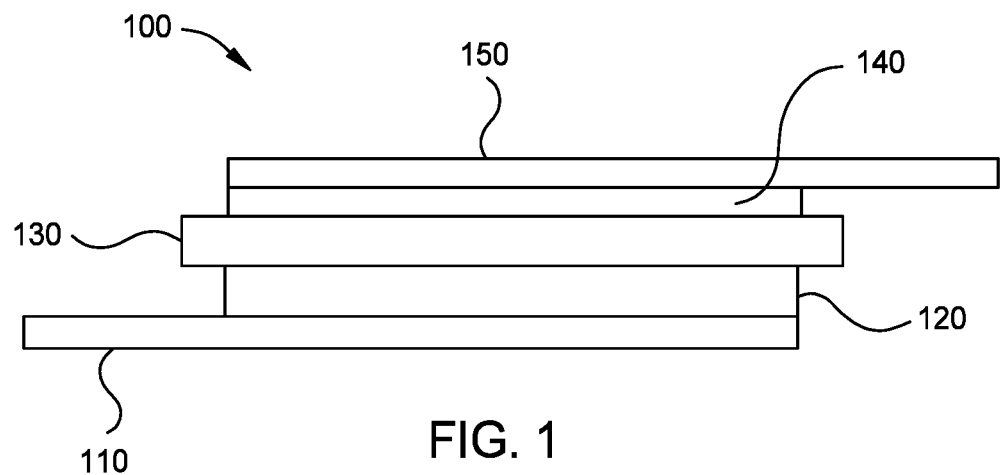
- FIG. 1 illustrates a cross-sectional view of one implementation of a cell structure formed according to one or more implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes systems, methods and an apparatus used for delivery of chemical precursors. Certain details are set forth in the following description and in FIGS. 1-5 to provide a thorough understanding of various implementations of the disclosure. Other details describing well-known structures and systems often associated with electrochemical cells and batteries are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a high rate evaporation process that can be carried out using a roll-to-roll coating system, such as TopMet™, SmartWeb™, TopBeam™ all of which are available from Applied Materials, Inc. of Santa Clara, Calif. Other tools capable of performing high rate evaporation processes may also be adapted to benefit from the implementations described herein. In addition, systems enabling thin film deposition can be used to advantage. The apparatus description described herein is illustrative and should not be construed or interpreted as limiting the scope of the implementations described herein. It should also be understood that although described as a roll-to-roll process, the implementations described herein may be performed on discrete polymer substrates.

Chemical vapor deposition (CVD), physical vapor deposition (PVD), evaporation processing chambers and other adjacent technologies may utilize several gases. These gases may be in the form of vaporized liquid precursors, generated and supplied to a processing chamber via a delivery pipe. Although several vaporizing mechanisms exist, most conventional gas delivery systems deliver gases at temperatures that exceed the thermal budget of the materials being processed.

In one implementation, a direct liquid injection (DLI) system for delivering liquid vapor to a processing chamber for deposition of thin films on porous plastic substrates at lower heat loads is provided. The processing chamber may be a roll-to-roll system. In one implementation, liquid water is vaporized and delivered to the processing chamber where oxidation of aluminum vapor occurs to produce and deposit a thin film (e.g., AlO(OH), $AlO_x$ ($0 \leq x \leq 2$), $Al_xO_y$ ($0 \leq x, y \leq 3$), or a mixed layer of AlO(OH), $Al_2O_3/AlO_x$ ($0 \leq x \leq 2$)) on a substrate at a low temperature (e.g., a temperature less than the melt temperature of the substrate). In another implementation, liquid water is vaporized and delivered to the processing chamber where oxidation of silicon vapor occurs to produce and deposit a thin film (e.g., $SiO_x$ ($0 \leq x \leq 2$), $Si(OH)_x$ ($0 \leq x \leq 2$), $SiO_xH_y$ ($0 \leq x, y \leq 2$)) on a substrate at a low temperature. In at least one aspect, the substrate is a plastic substrate, such as, polypropylene and/or polyethylene. In another aspect, the substrate has a film formed thereon, for example, a copper substrate having a lithium film formed thereon. In another aspect, the substrate is a copper substrate or an aluminum substrate. Thus, some implementations of the system described herein reduce thermal heat load, which allows for deposition of thin films on heat sensitive substrates. In at least one aspect, the substrate is a plastic substrate, such as, polypropylene and/or polyethylene). In another aspect, the substrate has a film formed thereon, for example, a copper substrate having a lithium film formed thereon. In another aspect, the substrate is a copper substrate or an aluminum substrate. Thus, some implementations of the system described herein reduce thermal heat load, which allows for deposition of thin films on heat sensitive substrates.

In one implementation, a direct liquid injection (DLI) system is provided. The DLI system is a liquid precursor source vaporization system, which vaporizes liquid stably and efficiently. In one implementation, the DLI system is a closed-loop integrated system, which includes an injection valve, a Liquid Flow Meter (LFM), and an ampoule assembly as a source of pressurized precursor. The DLI system may further include an inert push gas to pressurize the precursor in the ampoule assembly. The DLI system may further include a temperature controller to maintain a targeted temperature regime. The DLI system may further include a leak detection system. The DLI system may further include a controlled carrier gas flow to a gas heater with a segmented 316L SS line wrapped in band heaters and insulation.

In one implementation, the DLI system includes an injection valve. The injection valve includes a liquid water inlet for receiving a pressurized processing liquid with inert push gas from an ampoule assembly. The DLI system further includes a liquid flow meter, which enables precision liquid flow control. The injection valve further includes a heated carrier gas inlet for receiving a pressurized inert carrier gas, and a gas outlet for delivering a vaporized processing liquid and carrier gas mixture to a processing chamber. In one implementation, the injection valve is heated such that when the processing liquid is injected into the heated carrier gas, the heat and the low partial vapor pressure of the processing liquid in the carrier gas causes the processing liquid to vaporize. In some implementations, a high carrier gas pressure produces more processing liquid vaporization by lowering the partial vapor pressure of the processing liquid within the carrier gas. While designing a liquid delivery system, acceptable carrier gas pressure and safe transport of liquid in the mechanism is one consideration, as is minimizing overall system size and complexity.

In some implementations, the DLI system is integrated into a roll-to-roll web platform for various process precursor chemicals delivered in the vapor/gas phase and the film chemistry can be controlled by fine-tuning the precursor concentration with other process materials in the vapor state. In some implementations, software control enables fine-tuning of the process window for various composition of matter deposited on substrates.

In one implementation, a method of depositing an aluminum oxyhydroxide (e.g., AlO(OH)) thin film on a substrate is provided. The method includes forming aluminum vapor in a processing chamber, supplying oxygen gas to the processing chamber, and supplying moisture (e.g., water vapor) to the processing chamber using a DLI system as described herein. Control of the aluminum vapor, oxygen, and moisture supplied to the processing region may be achieved by controlling the aluminum evaporation rate (e.g., controlling boat temperature and aluminum wire feed), controlling oxygen flow rate via a mass flow controller, and controlling moisture supply via the DLI system.

In another implementation, a method of depositing a silicon-containing thin film on a substrate is provided. The method includes forming silicon vapor in the processing chamber, optionally supplying oxygen gas to the processing chamber, and supplying moisture (e.g., water vapor) to the processing chamber using a DLI system as described herein. Control of the silicon vapor, oxygen, and moisture supplied to the processing region may be achieved by controlling the silicon evaporation rate, controlling oxygen flow rate via a mass flow controller, and controlling moisture supply via the DLI system.

In one implementation, a computer readable medium is provided having instructions stored thereon that, when executed, causes a method of depositing an aluminum oxyhydroxide or silicon-containing thin film layer on a substrate to be performed in a processing chamber using the DLI system described herein. The method may include any implementations of the methods and systems disclosed herein.

As described herein, substrate can be considered to include among other things, flexible materials, porous polymeric materials, films, current collectors, conductive films (e.g., copper or aluminum), foils, webs, strips of plastic material, metal, paper, or other materials. Typically, the terms "web," "foil," "strip," "substrate" and the like are used synonymously.

FIG. 1 illustrates an example of a cell structure 100 having a ceramic-coated separator formed according to one or more implementations of the present disclosure. The cell structure 100 has a positive current collector 110, a positive electrode 120, a ceramic-coated separator 130, a negative electrode 140 and a negative current collector 150. The ceramic-coated separator 130 may be formed according to implementations described herein. Note in FIG. 1 that the current collectors are shown to extend beyond the stack, although it is not necessary for the current collectors to extend beyond the stack, the portions extending beyond the stack may be used as tabs. The cell structure 100, even though shown as a planar structure, may also be formed into a cylinder by rolling the stack of layers; furthermore, other cell configurations (e.g., prismatic cells, button cells) may be formed.

The current collectors 110, 150, on the positive electrode 120 and the negative electrode 140, respectively, can be identical or different electronic conductors. In one implementation, the current collector 110 comprises aluminum and the current collector 150 comprises copper.

The negative electrode 140 or anode may be any material compatible with the positive electrode 120. The negative electrode 140 may have an energy capacity greater than or equal to 372 mAh/g, preferably ≥700 mAh/g, and most preferably ≥1,000 mAh/g. The negative electrode 140 may be constructed from a graphite, silicon-containing graphite (e.g., silicon (<5%) blended graphite), a lithium metal foil or a lithium alloy foil (e.g. lithium aluminum alloys), or a mixture of a lithium metal and/or lithium alloy and materials such as carbon (e.g. coke, graphite), nickel, copper, tin, indium, silicon, oxides thereof, or combinations thereof.

The positive electrode 120 or cathode may be any material compatible with the anode and may include an intercalation compound, an insertion compound, or an electrochemically active polymer. Electrolytes infused in cell components 120, 130 and 140 can be comprised of a liquid/gel or a solid polymer and may be different in each. Any suitable electrolyte may be used.

Figure 2:
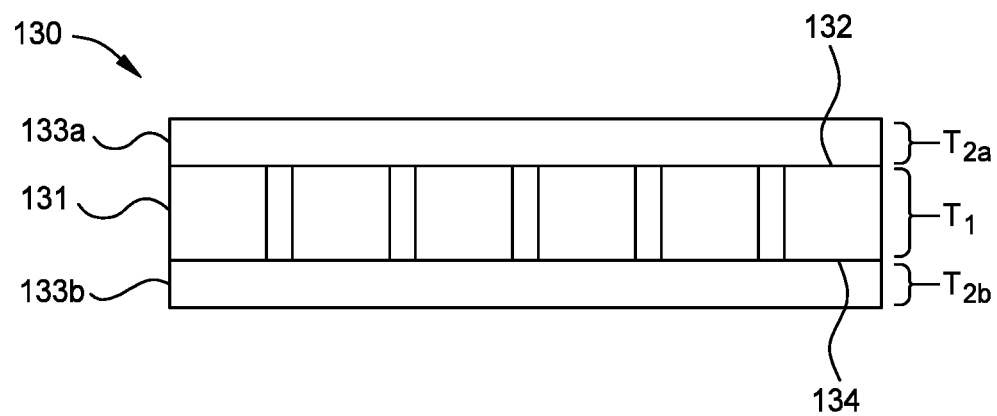
FIG. 2 illustrates a cross-sectional view of a ceramic-coated separator formed according to one or more implementations described herein.

FIG. 2 illustrates a cross-sectional view of the ceramic-coated separator 130 formed according to one or more implementations described herein. The ceramic-coated separator 130 includes a porous (e.g., microporous) polymeric substrate 131 capable of conducting ions (e.g., a separator film). The porous polymeric substrate 131 has a first surface 132 and a second surface 134 opposite the first surface 132. A ceramic-containing layer 133a, 133b (collectively 133) (e.g., ultra-thin ceramic coating) capable of conducting ions, is formed on at least a portion of the first surface 132 of the porous polymeric substrate 131 and optionally a portion of the second surface 134 of the porous polymeric substrate 131. The ceramic-containing layer 133 is, at least, adapted for preventing electronic shorting (e.g. direct or physical contact of the anode and the cathode) and blocking dendrite growth. The porous polymeric substrate 131 may be, at least, adapted for blocking (or shutting down) ionic conductivity (or flow) between the anode and the cathode during the event of thermal runaway. The ceramic-containing layer 133 is sufficiently conductive to allow ionic flow between the anode and cathode, so that the cell structure 100 generates current in targeted quantities. As discussed herein, in one implementation, the ceramic-containing layer 133 is formed using the DLI system described herein.

In one implementation, the porous polymeric substrate 131 is a microporous ion-conducting polymeric substrate. In one implementation, the porous polymeric substrate 131 is a multi-layer polymeric substrate. In some implementations, the porous polymeric substrate 131 is selected from any commercially available polymeric microporous membranes (e.g., single or multi-ply), for example, those products produced by produced by Polypore (Celgard Inc., of Charlotte, N.C.), Toray Tonen (Battery separator film (BSF)), SK Energy (lithium ion battery separator (LiBS)), Evonik industries (SEPARION® ceramic separator membrane), Asahi Kasei (Hipore™ polyolefin flat film membrane), DuPont (Energain®), etc. In some implementations, the porous polymeric substrate 131 has a porosity in the range of 20 to 80% (e.g., in the range of 28 to 60%). In some implementations, the porous polymeric substrate 131 has an average pore size in the range of 0.02 to 5 microns (e.g., 0.08 to 2 microns). In some implementations, the porous polymeric substrate 131 has a Gurley Number in the range of 15 to 150 seconds. In some implementations, the porous polymeric substrate 131 comprises a polyolefin polymer. Examples of suitable polyolefin polymers include polypropylene, polyethylene, or combinations thereof. In some implementations, the porous polymeric substrate 131 is a polyolefinic membrane. In some implementations, the polyolefinic membrane is a polyethylene membrane or a polypropylene membrane.

In one implementation, the porous polymeric substrate 131 has a thickness "$T_1$" in a range from about 1 micron to about 50 microns, for example, in a range from about 3 microns to about 25 microns; in a range from about 7 microns to about 12 microns; or in a range from about 14 microns to about 18 microns.

The ceramic-containing layer 133 includes one or more ceramic materials. The ceramic material may be an oxide. In one implementation, the ceramic-containing layer 133 includes a material selected from, for example, aluminum oxide ($Al_2O_3$), $AlO_x$ ($0 \leq x \leq 2$), $Al_xO_y$ ($0 \leq x, y \leq 3$), a mixed layer of AlO(OH), $Al_2O_3/AlO_x$ ($0 \leq x \leq 2$), $AlO_xN_y$, AlN (aluminum deposited in a nitrogen environment), aluminum hydroxide oxide ((AlO(OH)) (e.g., diaspore (($\alpha$-AlO(OH))), boehmite ($\gamma$-AlO(OH)), or akdalaite ($5Al_2O_3 \cdot H_2O$)), calcium carbonate ($CaCOa_3$), titanium dioxide ($TiO_2$), $SiS_2$, $SiPO_4$, silicon oxide ($SiO_2$), $SiO_x$ ($0 \leq x \leq 2$), $Si(OH)_x$ ($0 \leq x \leq 2$), $SiO_xH_y$ ($0 \leq x,y \leq 2$), zirconium oxide ($ZrO_2$), hafnium oxide ($HfO_2$), MgO, $TiO_2$, $Ta_2O_5$, $Nb_2O_5$, $LiAlO_2$, $BaTiO_3$, BN, ion-conducting garnet, ion-conducting perovskite, ion-conducting anti-perovskites, porous glass ceramic, and the like, or combinations thereof. In one implementation, the ceramic-containing layer 133 comprises a combination of $AlO_x$ and $Al_2O_3$. In one implementation, the ceramic-containing layer 133 includes a material selected from the group comprising, consisting of, or consisting essentially of porous aluminum oxide, porous-$ZrO_2$, porous-$HfO_2$, porous-$SiO_2$, porous-MgO, porous-$TiO_2$, porous-$Ta_2O_5$, porous-$Nb_2O_5$, porous-$LiAlO_2$, porous-$BaTiO_3$, ion-conducting garnet, anti-ion-conducting perovskites, porous glass dielectric, or combinations thereof. The ceramic-containing layer 133 is a binder-free ceramic layer. In some implementations, the ceramic-containing layer 133 is a porous aluminum oxide layer. In some implementations, the ceramic-containing layer is an aluminum oxide hydroxide AlO(OH). In one implementation, the ceramic-containing layer 133 is deposited using evaporation techniques and the DLI system described herein.

In one implementation, the ceramic-containing layer 133 has a thickness "$T_{2a}$" and "$T_{2b}$" (collectively $T_2$) in a range from about 1 nanometer to about 1,000 nanometers, for example, in a range from about 50 nanometers to about 500 nanometers; or in a range from about 50 nanometers to about 200 nanometers.

In one implementation, the ceramic-containing layer 133 is formed on a substrate other than the porous polymeric substrate 131. For example, the ceramic-containing layer 133 is formed on a substrate selected from flexible materials, films, foils, webs, strips of plastic material, metal, or paper. In one implementation, the ceramic-containing layer 133 is formed on a metal film, such as, for example, a copper film or an aluminum film. In another implementation, the ceramic-containing layer 133 is formed on a film, such as negative electrode 140 (e.g., a lithium metal film), which may be formed on current collector 150 (e.g., a copper substrate). In yet another implementation, the ceramic-containing layer is formed on a film, such as a positive electrode 120, which may be formed on a current collector 110 (e.g., an aluminum substrate).

Figure 3:
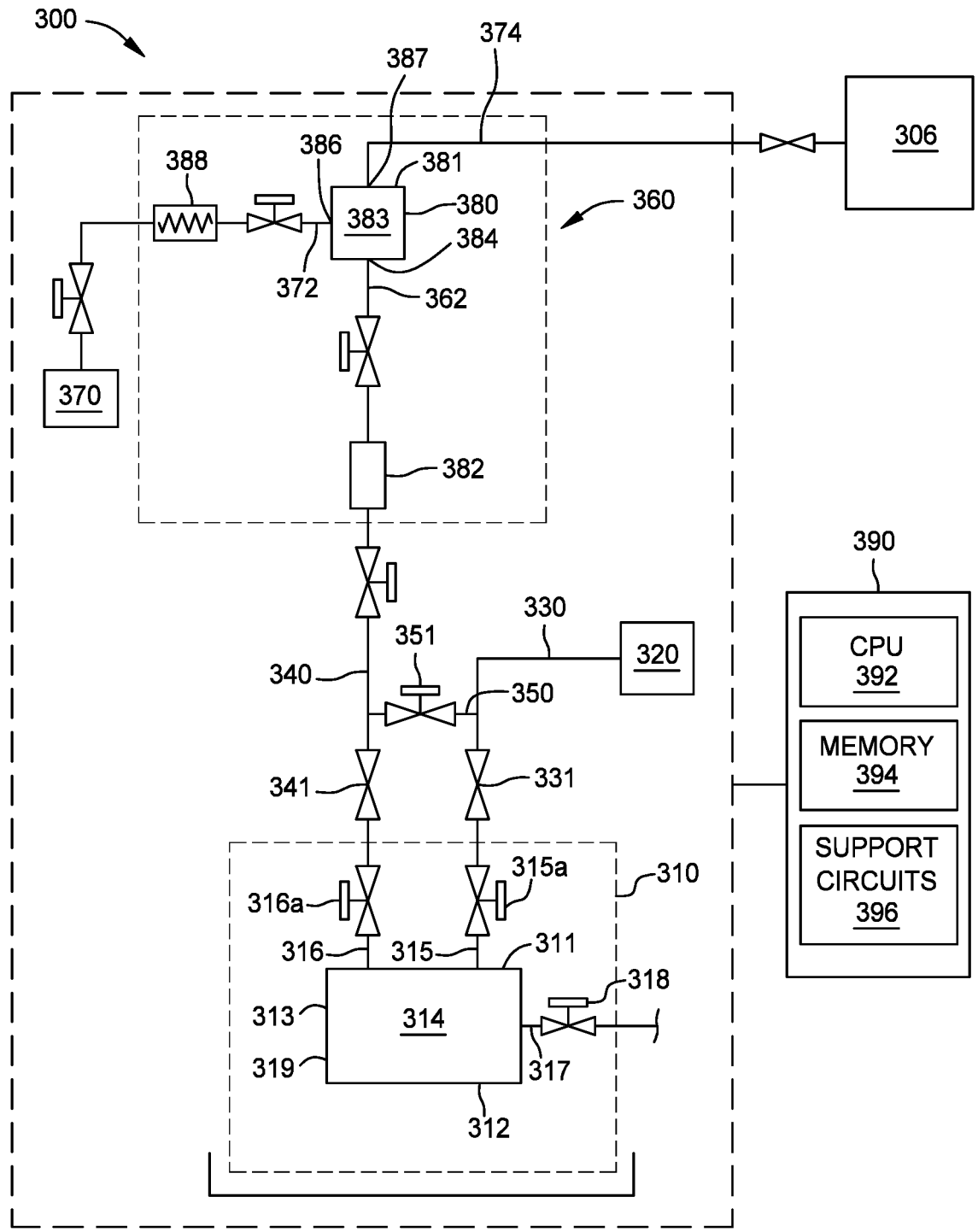
FIG. 3 illustrates a schematic view of a liquid delivery system according to one or more implementations of the present disclosure.

FIG. 3 illustrates a schematic view of a direct liquid injection (DLI) system 300 according to one or more implementations of the present disclosure. The DLI system 300 is suitable for producing a process gas containing a chemical precursor. The DLI system 300 is generally coupled with a processing chamber 306. The processing chamber 306 may be a chamber operable to conduct vapor deposition processes or thermal processes containing a vaporized chemical precursor in liquid or gaseous state. In one implementation, the processing chamber 306 is a physical vapor deposition (PVD) chamber, an evaporation chamber, a chemical vapor deposition chamber, or an atomic layer deposition chamber.

The DLI system 300 includes an ampoule assembly 310, shown in dotted lines. In some implementations, the ampoule assembly 310 is intended to be used with the DLI system 300, but is not a part of the DLI system 300. The ampoule assembly 310 includes a canister 319 having a top surface 311, a bottom surface 312 and a sidewall 313 defining an interior volume 314. The ampoule assembly 310 includes an inlet 315 and an outlet 316. In some implementations, the ampoule assembly 310 includes at least one additional conduit 317 in fluid communication with the interior volume 314 of the canister 319. In some implementations, the additional conduit 317 includes an isolation valve 318 and can be used to pressurize or depressurize the ampoule assembly 310. The inlet 315 is disposed through the lid or the top surface 311 of the canister 319 and is operable to provide a liquid precursor to the interior volume 314 of the canister 319. The outlet 316 is disposed through the lid or the top surface 311 of the canister 319 and is operable to allow the liquid precursor to flow out of the canister 319. The inlet 315 may include an inlet isolation valve 315a to isolate the inlet from the ambient environment when the ampoule assembly 310 is not connected to the DLI system 300. The outlet 316 may include an outlet isolation valve 316a to isolate the outlet from the ambient environment when the ampoule assembly 310 is not connected to the DLI system 300. After connecting the ampoule assembly 310 to the DLI system 300, the inlet isolation valve 315a and the outlet isolation valve 316a can be opened to allow fluid communication with the interior volume 314 of the ampoule assembly 310.

In some implementations, the canister 319 is certified by the Department of Transportation (DOT). In one implementation, for reasons of chemical compatibility and mechanical strength, the canister 319 is made of a stainless steel, such as 316 stainless steel (316 SST). In one implementation, the material of the canister 319 is fairly chemically inert since different types of chemical precursors, such as highly reactive materials may be stored within the canister 319. In some implementations, the sidewall 313, the top surface 311 and the bottom surface 312 of the canister 319 each have a thickness from between about 2 millimeters to about 10 millimeters (e.g., from between about 2 millimeters to about 6 millimeters; or from between about 5 millimeters to about 6 millimeters).

The ampoule assembly 310 can contain any type of precursor suitable for use in the intended deposition process. In some implementations, the ampoule assembly 310 contains a liquid precursor. The liquid precursor can be added to the ampoule assembly 310 by separating the top surface 311 from the canister 319, or through the additional conduit 317.

The DLI system 300 further includes an inlet line 330 in fluid communication with a push gas or a push gas source 320. In one implementation, the push gas is used to pressurize the ampoule assembly 310. The push gas source 320 may include any push gas that is compatible with the liquid precursor contained in the ampoule assembly 310. Examples of suitable push gases include inert gases such as helium, nitrogen, argon, or combinations thereof.

The inlet line 330 has an ampoule inlet valve 331 to control the flow of the push gas into the ampoule assembly 310, when the ampoule assembly 310 is present. The DLI system 300 also includes an outlet line 340 comprising an ampoule outlet valve 341 to control the flow of the liquid precursor and push gas exiting the ampoule assembly 310.

A bypass line 350 connects the inlet line 330 and the outlet line 340. The bypass line 350 comprises a bypass valve 351 downstream of the outlet isolation valve 316a. The bypass valve 351 allows push gas to flow from the inlet line 330 to purge the outlet line 340 without flowing push gas into the ampoule assembly 310. For example, when there is no ampoule assembly 310 present, the bypass valve 351 can be open to allow the flow of push gas. In some implementations, the bypass line 350 and the bypass valve 351 are upstream of the ampoule inlet valve 331. In one or more implementations, the bypass line 350 connects to the inlet line 330 downstream of the ampoule inlet valve 331. In some implementations, the bypass line 350 and the bypass valve 351 are in communication with the outlet line 340 downstream of the ampoule outlet valve 341. In one or more implementations, the bypass line 350 connects to the outlet line 340 upstream of the ampoule outlet valve 341. In some implementations, the bypass line 350 connects to and is in fluid communication with the inlet line 330 upstream of the ampoule inlet valve 331 and connects to and is in fluid communication with the outlet line 340 downstream of the ampoule outlet valve 341. In one or more implementations, the bypass line 350 connects to and is in fluid communication with the inlet line 330 downstream of the ampoule inlet valve 331 and connects to and is in fluid communication with the outlet line 340 upstream of the ampoule outlet valve 341.

The DLI system 300 further includes a vaporizer assembly 360. The vaporizer assembly 360 is operable to vaporize a liquid reactant and flow the vaporized reactant, usually along with a carrier gas, to a processing chamber, such as processing chamber 306. The vaporizer assembly 360 is connected with two inputs: the ampoule assembly 310 via an input line 362, and a carrier gas source 370 via an input line 372. The vaporizer assembly 360 has an output line 374, which may be connected to a processing chamber, such as the processing chamber 306.

The vaporizer assembly 360 may be used to vaporize suitable liquid reactants, for example, aluminum-containing precursors, silane-containing precursors, tetraethyl orthosilicate (TEOS), water or the like. The liquid converts to vapor by expansion and the vapor flows to the processing chamber 306 by a carrier gas, such as helium, nitrogen or argon, supplied by the carrier gas source 370.

The vaporizer assembly 360 comprises an injection valve 380 operable to vaporize a liquid reactant and a liquid flow meter 382 operable to measure a flow rate of the liquid reactant flown to the injection valve 380. The injection valve 380 includes a valve body 381 defining an interior region 383. The injection valve 380 further includes a gas inlet port 386 in fluid communication with the interior region 383 and the carrier gas source 370. The injection valve 380 further includes a liquid inlet port 384 in fluid communication with the interior region 383 and the ampoule assembly 310. The injection valve 380 further includes a vapor outlet port 387 in fluid communication with the interior region 383 and the processing chamber 306. The injection valve 380 may include additional components such as diaphragms, actuators (e.g., piezoelectric actuators), and pistons to control the flow of fluids through the injection valve 380.

In one implementation, an inlet of the liquid flow meter 382 is connected to the input line 372 and an outlet of the liquid flow meter 382 is connected to the liquid inlet port 384 of the injection valve 380. The carrier gas source 370 containing a carrier gas is connected to the gas inlet port 386 of the injection valve 380 through a heater 388, which heats the carrier gas supplied by the carrier gas source 370.

A controller 390 may be provided and coupled to various components of the processing chamber 306 and DLI system 300 to control the operation thereof. The controller 390 includes a central processing unit (CPU) 392, a memory 394, and support circuits 396. The controller 390 may control the DLI system 300 directly, or via computers (or controllers) associated with particular process chamber and/or support system components. The controller 390 may be one of any form of general-purpose computer processor that can be used in an industrial setting for controlling various chambers and sub-processors. The memory, or computer readable medium, 394 of the controller 390 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 396 are coupled to the CPU 392 for supporting the processor in a conventional manner. These circuits include cache, power supplies, clock circuits, input/output circuitry and subsystems, and the like. The methods as described herein may be stored in the memory 394 as software routine that may be executed or invoked to control the operation of the DLI system 300 and/or processing chamber 306 in the manner described herein. The software routine may also be stored and/or executed by a second CPU (not shown) that is remotely located from the hardware being controlled by the CPU 392. In one implementation, the controller 390 is operable to control the flow rate of the liquid reactant to the injection valve 380. In one implementation, the controller 390 is connected to the vaporizer assembly 360 and is operable to control the flow rate of fluids into and out of the vaporizer assembly 360 and to monitor the performance of the vaporizer assembly 360.

In operation, a liquid precursor, for example, water is stored in the ampoule assembly 310. Push gas flows from the push gas source 320 via inlet line 330 into the canister 319 to push the liquid precursor out of the canister 319 and into outlet line 340. The flow of pressurized liquid precursor through the outlet line 340 and into input line 362 is regulated by the liquid flow meter 382 and the controller 390. The injection valve 380 receives the pressurized liquid precursor via the liquid inlet port 384. Pressurized heated carrier gas is delivered from the carrier gas source 370 and heated by heater 388. The heated pressurized carrier gas enters the injection valve 380 via gas inlet port 386. In one implementation, the injection valve 380 is heated such that when the pressurized liquid precursor is injected into the heated carrier gas, the heat and the low partial vapor pressure of the liquid precursor in the heated carrier gas causes the liquid precursor to vaporize. In some implementations, a high carrier gas pressure leads to increased vaporization of the liquid precursor by lowering the partial vapor pressure of the processing liquid within the carrier gas. The vaporized liquid precursor is then delivered to the processing chamber 306 via the output line 374.

Figure 4A:
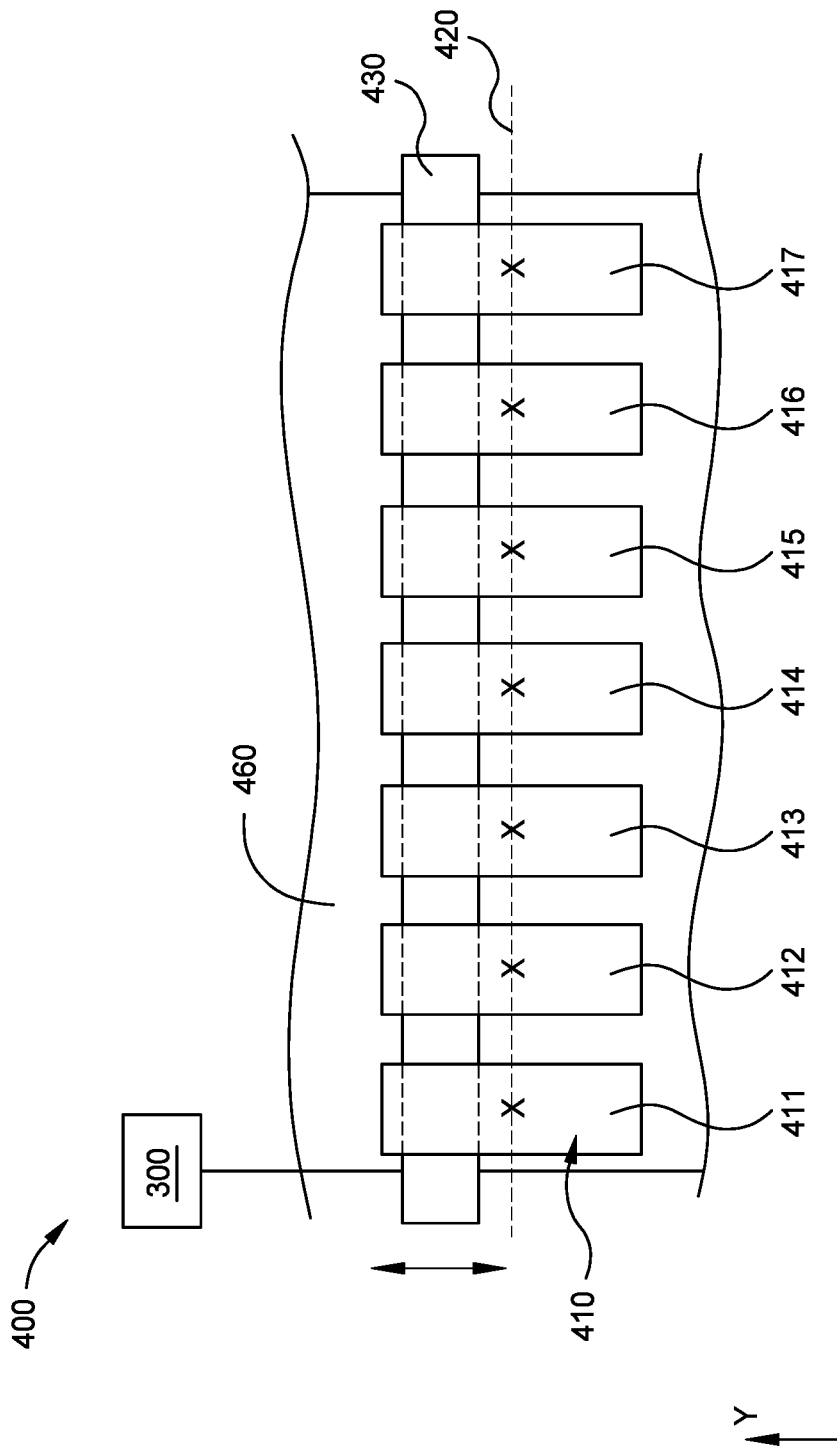
FIG. 4A illustrates a schematic top view of an evaporation apparatus according to one or more implementations of the present disclosure.
Figure 4B:
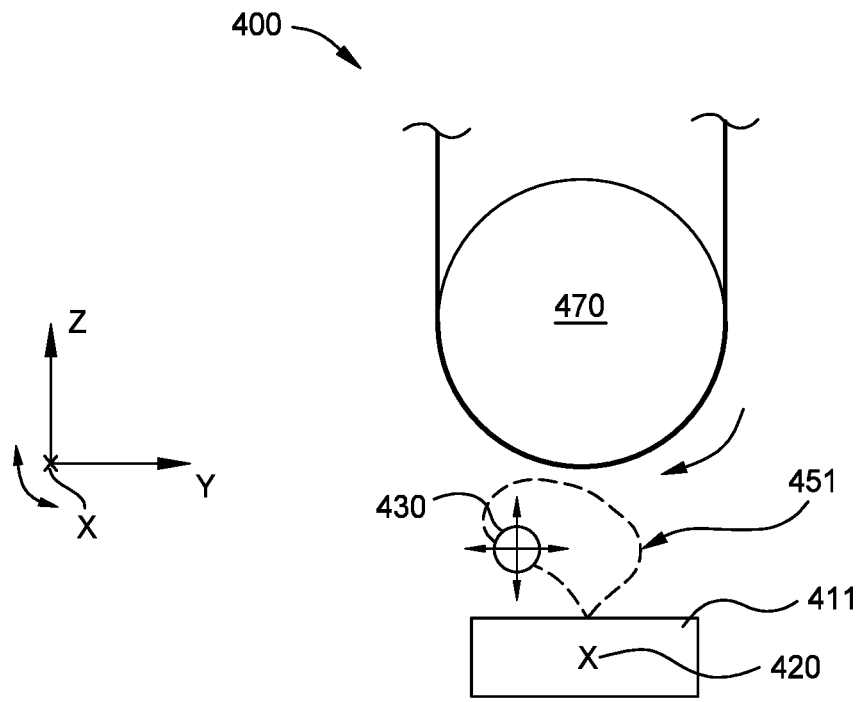
FIG. 4B illustrates a schematic front view of the evaporation apparatus shown in FIG. 4A.
Figure 4C:
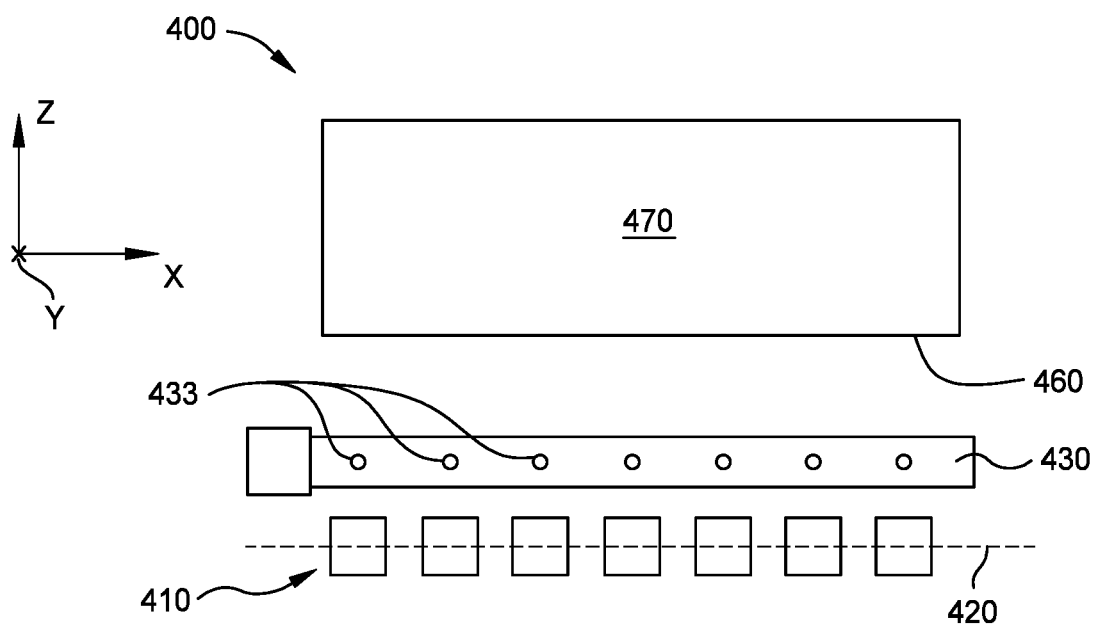
FIG. 4C illustrates a schematic side view of the evaporation apparatus shown in FIG. 4A

FIG. 4A illustrates a schematic top view of an evaporation apparatus 400 having a liquid delivery system, such as the DLI system 300, according to one or more implementations described herein. FIG. 4B illustrates a schematic front view of the evaporation apparatus 400 shown in FIG. 4A. FIG. 4C illustrates a schematic side view of the evaporation apparatus 400 shown in FIG. 4A. The evaporation apparatus 400 may be used to form the ceramic-coated separator as described herein. For example, the evaporation apparatus may be used to deposit an ultra-thin ceramic coating, for example, the ceramic-containing layer 133, on a flexible conductive substrate, for example, the porous polymeric substrate 131.

In some implementations, as shown in FIGS. 4A and 4B, the evaporation apparatus 400 includes a first set 410 of evaporation crucibles aligned in a first line 420 along a first direction, e.g. along the x-direction shown in FIG. 4A, for generating a cloud 451 of evaporated material to be deposited on a flexible substrate 460. In one implementation, the flexible substrate 460 includes a porous polymeric substrate, for example, the porous polymeric substrate 131.

With reference to FIG. 4A, typically the flexible substrate 460 moves in the y-direction during the deposition process. The first set 410 of evaporation crucibles shown in FIG. 4A includes crucibles 411 to 417. Further, as shown in FIG. 4C, the evaporation apparatus 400 includes a gas supply pipe 430 extending in the first direction and being arranged between the first set 410 of evaporation crucibles and a processing drum 470. In one implementation, the gas supply pipe 430 is fluidly coupled with the DLI system 300. As shown in FIG. 4C, typically the gas supply pipe 430 includes a plurality of outlets 433 for providing a gas supply directed into the cloud 451 of evaporated material. Further, as indicated by the double arrows in FIG. 4B, the evaporation apparatus is configured such that a position of the plurality of outlets is adjustable for changing a position of the gas supply directed into the cloud 451 of evaporated material.

Accordingly, it is to be understood that the evaporation apparatus 400 as described herein may be an evaporation apparatus for a reactive evaporation process. In some implementations, the herein described crucibles may be adapted for providing evaporated material on the substrate to be coated. For example, the crucibles may provide one component of the material to be deposited as a layer on the substrate. In particular, the crucibles described herein may include a metal, e.g. aluminum, which is evaporated in the crucibles. Further, the evaporated material from the crucibles may react with a further component, e.g. a reactive gas such as water vapor, moist oxygen, oxygen, and/or a plasma such as an oxygen-containing plasma, in the evaporation apparatus for forming a ceramic-containing layer as described herein on the flexible substrate. Accordingly, the aluminum from the crucibles together with the water vapor, moist oxygen, oxygen, and/or oxygen-containing plasma as described herein may form a layer of AlO(OH), $AlO_x$, $Al_2O_3$, and/or a mixed layer of AlO(OH), $Al_2O_3$/$AlO_x$ on the flexible substrate in the evaporation apparatus according to implementations described herein. In view of the implementations described herein, the skilled person understands that any material, specifically any metal, may be used as material in the crucibles as long as the vapor pressure of the material may be achieved by thermal evaporation.

During processing, the flexible substrate 460 is subjected to the material evaporated by the first set 410 of evaporation crucibles as indicated by the cloud 451 of evaporated material, as exemplarily shown in FIG. 4B. Further, during processing, a gas supply and/or plasma is directed into the cloud 451 of evaporated material, such that a portion of the evaporated material may react with the supplied gas and/or plasma. Accordingly, the flexible substrate 460 is further subjected to evaporated material, which has been reacted with the supplied gas and/or plasma such that during processing, the flexible substrate 460 is coated with a layer including the material evaporated by the crucibles and the supplied gas and/or plasma, for example, in the form of reactive products of the components provided by the crucible and the gas supply pipe.

Figure 5:
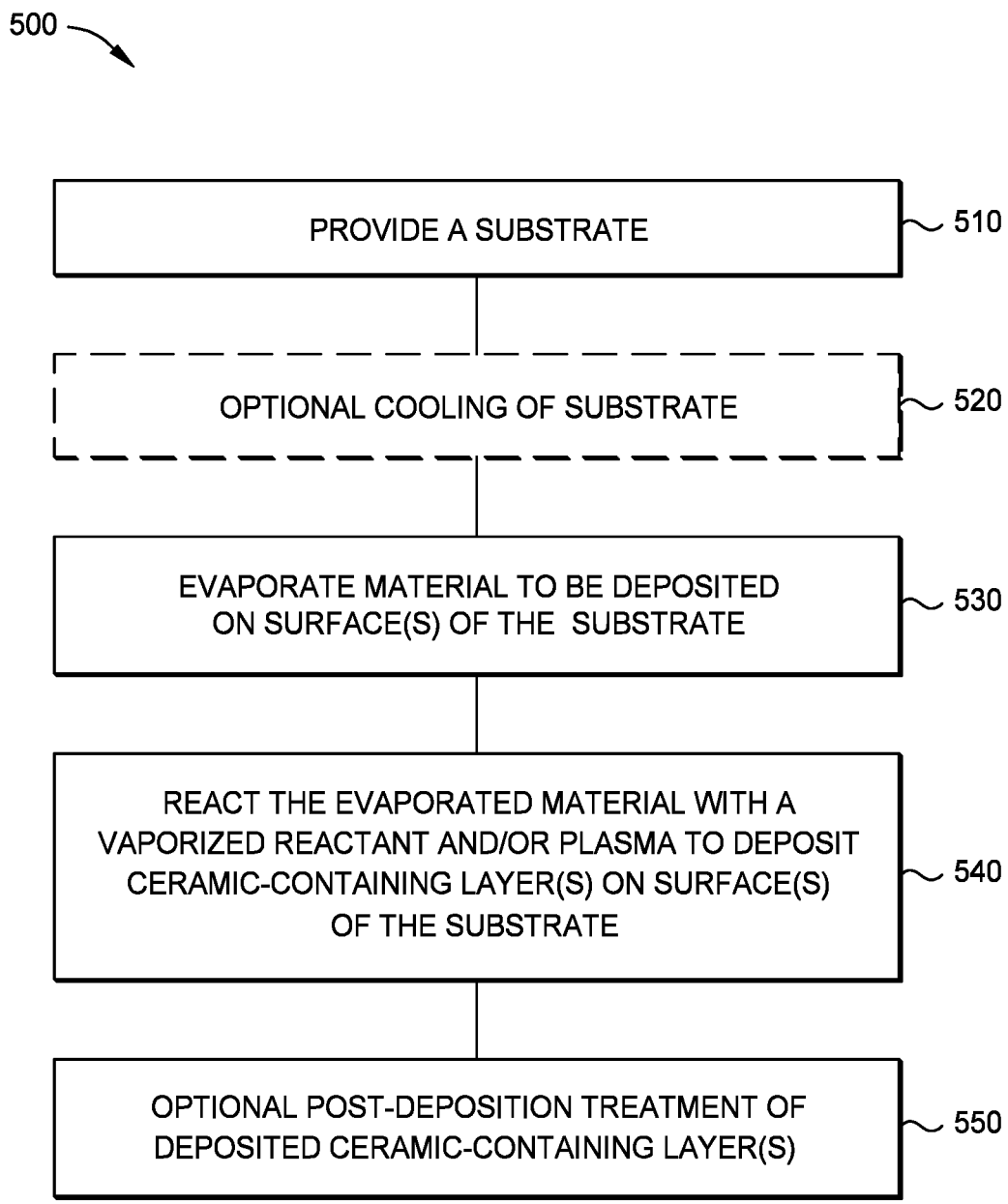
FIG. 5 illustrates a process flow chart summarizing one implementation of a method for forming a ceramic coating on a substrate according to one or more implementations of the present disclosure.

FIG. 5 illustrates a process flow chart 500 summarizing one implementation of a method for forming a ceramic coating on a substrate according to one or more implementations of the present disclosure. In one implementation, the method is stored on a computer readable medium. In one implementation, the method is performed using the DLI system 300 and evaporation apparatus 400.

At operation 510, a substrate is provided. In one implementation, the substrate is a porous polymeric substrate, such as the porous polymeric substrate 131. In one implementation, the substrate is flexible substrate 460. In one implementation, the ceramic-containing layer 133 is formed on a substrate other than the porous polymeric substrate 131. For example, the ceramic-containing layer 133 is formed on a substrate selected from flexible materials, conductive films, foils, webs, strips of plastic material, metal, or paper. In one example, the ceramic-containing layer 133 is formed on a metal substrate, such as, for example, a copper substrate or an aluminum substrate. In another example, the ceramic-containing layer 133 is formed on a film, such as negative electrode 140 (e.g., a lithium metal film), which may be formed on current collector 150 (e.g., a copper substrate).

At operation 520, the substrate is optionally exposed to a cooling process. In one implementation, the substrate may be cooled to a temperature between −20 degrees Celsius and room temperature (i.e., 20 to 22 degrees Celsius) (e.g., −10 degrees Celsius and 0 degrees Celsius). In one implementation, the substrate may be cooled by cooling the processing drum over which the substrate travels during processing. Other active cooling means may be used to cool the substrate. During the evaporation process, the substrate may be exposed to temperatures in excess of 1,000 degrees Celsius, thus it is beneficial to cool the substrate prior to the evaporation process of operation 530.

At operation 530, the material to be deposited on the substrate is exposed to an evaporation process to evaporate the material to be deposited on the substrate in a processing region. In one implementation, the material to be evaporated is an aluminum-containing material. In another implementation, the material to be evaporated is a silicon-containing material. The evaporated material is the material that is evaporated during the evaporation process and with which the substrate is coated. The material to be deposited (e.g., aluminum) can be provided in a crucible. The material to be deposited, for example, can be evaporated by thermal evaporation techniques or by electron beam evaporation techniques. The material to be deposited (e.g., silicon) can be evaporated using e-beam evaporation techniques. In another implementation, the material to be deposited is deposited using chemical vapor deposition (CVD) or atomic layer deposition (ALD) techniques. For example, in one implementation, the material to be deposited is $Al_2O_3$, which is deposited by an ALD process.

In some implementations, the material to be evaporated is fed to the crucible as a wire. In this case, the feeding rates and/or the wire diameters are chosen such that the targeted ratio of the evaporation material and the reactive gas is achieved. In some implementations, the diameter of the feeding wire for feeding to the crucible is chosen between 0.5 mm and 2.0 mm (e.g., between 1.0 mm and 1.5 mm). These dimensions may refer to several feeding wires made of the evaporation material. In one implementation, feeding rates of the wire are in the range of between 50 cm/min and 150 cm/min (e.g., between 70 cm/min and 100 cm/min).

The crucible is heated in order to generate a vapor (e.g., an aluminum vapor), which reacts with the reactive gases and/or plasma supplied at operation 540 to coat the substrate 131 with a ceramic-containing layer such as the ceramic-containing layer 133. Typically, the crucible is heated by applying a voltage to the electrodes of the crucible, which are positioned at opposite sides of the crucible.

In some implementations, the evaporation unit is typically heatable to a temperature of between 1,300 degrees Celsius and 1,600 degrees Celsius, such as 1,560 degrees Celsius. Heating of the crucible may be performed by adjusting the current through the crucible accordingly, or by adjusting the irradiation accordingly. Typically, the crucible material is chosen such that its stability is not negatively affected by temperatures of that range. Typically, the speed of the porous polymeric substrate 131 is in the range of between 20 cm/min and 200 cm/min, more typically between 80 cm/min and 120 cm/min such as 100 cm/min. In these cases, the means for transporting should be capable of transporting the substrate at those speeds.

At operation 540, the evaporated material is reacted with a vaporized reactant and/or plasma to form the ceramic-containing layer, such as the ceramic-containing layer 133, on a surface, of the substrate. According to some implementations, which can be combined with other implementations described herein, the vaporized reactant gases can be selected from the group comprising, consisting of, or consisting essentially of: water vapor, moist oxygen, oxygen-containing gases, and/or nitrogen-containing gases. The plasma may be a nitrogen-containing plasma, an oxygen-containing plasma, or a combination thereof. Examples of oxygen-containing gases that may be used with the implementations described herein include oxygen ($O_2$), ozone ($O_3$), oxygen radicals ($O^*$), or combinations thereof. Examples of nitrogen containing gases that may be used with the implementations described herein include $N_2$, $N_2O$, $NO_2$, $NH_3$, or combinations thereof. According to some implementations, additional gases, typically inert gases such as argon can be added to a gas mixture comprising the vaporized reactant gas. Thus, the amount of vaporized reactant gas can be more easily controlled. According to some implementations, which can be combined with other implementations described herein, the process can be carried out in a vacuum environment with a typical atmosphere of $1*10^{-2}$ mbar to $1*10^{-5}$ mbar (e.g., $1*10^{-3}$ mbar or below; $1*10^{-4}$ mbar or below).

In one implementation, the method includes forming aluminum vapor in the processing chamber, supplying oxygen gas to the processing chamber, and supplying moisture (e.g., water vapor) to the processing chamber using a DLI system, for example, the DLI system 300 as described herein. Control of the aluminum vapor, oxygen, and moisture supplied to the processing region may be achieved by controlling the aluminum evaporation rate (e.g., controlling boat temperature and aluminum wire feed), controlling oxygen flow rate via a mass flow controller, and controlling moisture supply via the DLI system.

In another implementation, oxidation of evaporated material is performed by direct injection of vapor from the DLI unit. As an example, silicon is evaporated using e-beam and partially oxidized to non-stoichiometric $SiO_x$ ($0 \leq x \leq 2$), $Si(OH)_x$ ($0 \leq x \leq 2$), $SiO_xH_y$ ($0 \leq x,y \leq 2$) material on a substrate, for example, a copper current collector or metallized plastic current collector to form an $SiO_x/Si(OH)_x$ anode.

In one implementation, the ceramic-containing layer is selected from $SiO_x$ ($0 \leq x \leq 2$), $Si(OH)_x$ ($0 \leq x \leq 2$), $SiO_xH_y$ ($0 \leq x, y \leq 2$), $AlO(OH)$, $AlO_x$ ($0 \leq x \leq 2$), $Al_xO_y$ ($0 \leq x,y \leq 3$), or a mixed layer of $AlO(OH)$, $Al_2O_3/AlO_x$ ($0 \leq x \leq 2$).

At operation 550, an optional post-deposition treatment of the deposited ceramic-containing layer is performed. The optional post-deposition treatment may include a post-deposition plasma treatment to densify the deposited ceramic-containing layer, additional "functionalization" processes may be performed post-deposition; for example, complete oxidation of $AlO_x$ to form $Al_2O_3$, or deposition of polymer material to enhance puncture resistance of the membrane.

In summary, some of the benefits of the present disclosure include the efficient deposition of a thin film (e.g., ceramic) directly onto a porous plastic substrate at temperatures within the thermal budget of the porous plastic substrate. In some implementations, a direct liquid injection (DLI) system for delivering liquid vapor to a processing chamber for deposition of thin films on porous plastic substrates at lower heat loads is provided. In one implementation, liquid water is vaporized and delivered to the processing chamber where oxidation of aluminum vapor occurs to produce and deposit a thin film (e.g., $AlO(OH)$) on plastic substrates (e.g., polypropylene and polyethylene) at low temperatures (e.g., temperatures less than the melt temperature of the plastic substrates). Thus, some implementations of the system described herein reduce thermal heat load, which allows for deposition of thin films on heat sensitive substrates.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. An apparatus, comprising:
a vaporizer assembly operable to vaporize a liquid reactant and flow the vaporized reactant to a processing chamber, comprising:
an injection valve operable to receive the liquid reactant, vaporize the liquid reactant, and deliver the vaporized reactant, comprising:
a valve body encompassing an interior region therein;
a gas inlet port in fluid communication with the interior region;
a liquid inlet port in fluid communication with the interior region; and
a vapor outlet port in fluid communication with the interior region;
a first inlet line, comprising:

a first end of the first inlet line fluidly coupled with the liquid inlet port; and
a second end of the first inlet line; and
a second inlet line, comprising:
a first end of the second inlet line fluidly coupled with the gas inlet port;
a second end of the second inlet line fluidly coupled with a carrier gas source; and
a heater positioned along the second inlet line between the first end of the second inlet line and the second end of the second inlet line, wherein the heater is operable for heating a carrier gas supplied by the carrier gas source;
an ampoule assembly operable to supply the liquid reactant, comprising:
a canister comprising a sidewall, a top surface, and a bottom surface encompassing an interior volume therein; and
an inlet port and an outlet port in fluid communication with the interior volume;
a third inlet line, comprising:
a first end of the third inlet line fluidly coupled with the inlet port of the ampoule assembly; and
a second end of the third inlet line to be connected to a push gas source; and
a first outlet line comprising:
a first end of the first outlet line fluidly coupled with the outlet port of the ampoule assembly; and
a second end of the first outlet line fluidly coupled with the second end of the first inlet line.

2. The apparatus of claim 1, wherein the second end of the third inlet line is connected to the push gas source and the push gas source comprises a gas selected from helium, nitrogen, argon, or combinations thereof.

3. The apparatus of claim 1, further comprising a liquid flow meter positioned between the first end of the first inlet line and the second end of the first inlet line operable to measure a flow rate of the liquid reactant flown to the injection valve.

4. The apparatus of claim 1, wherein the liquid reactant is selected from silane-containing precursors, tetraethyl orthosilicate (TEOS), or water.

5. The apparatus of claim 1, wherein the carrier gas is selected from helium, nitrogen or argon.

6. The apparatus of claim 1, further comprising a bypass line connecting the third inlet line and the first outlet line, the bypass line comprising a bypass valve which is positioned to allow the push gas from the push gas source to flow from the third inlet line to the first outlet line without flowing through the ampoule assembly.

7. A system comprising:
a processing chamber; and
a direct liquid injection system operable to deliver a vaporized precursor to the processing chamber, comprising:
a vaporizer assembly operable to vaporize a liquid reactant and flow the vaporized reactant to the processing chamber, comprising:
an injection valve operable to receive the liquid reactant, vaporize the liquid reactant, and deliver the vaporized reactant, comprising:
a valve body encompassing an interior region therein;
a gas inlet port in fluid communication with the interior region;
a liquid inlet port in fluid communication with the interior region; and
a vapor outlet port in fluid communication with the interior region;
a first inlet line, comprising:
a first end of the first inlet line fluidly coupled with the liquid inlet port; and
a second end of the first inlet line; and
a second inlet line, comprising:
a first end of the second inlet line fluidly coupled with the gas inlet port;
a second end of the second inlet line fluidly coupled with a carrier gas source; and
a heater positioned along the second inlet line between the first end of the second inlet line and the second end of the second inlet line wherein the heater is operable for heating a carrier gas supplied by the carrier gas source;
an ampoule assembly operable to supply the liquid reactant, comprising:
a canister comprising a sidewall, a top surface, and a bottom surface encompassing an interior volume therein; and
an inlet port and an outlet port in fluid communication with the interior volume:
a third inlet line, comprising:
a first end of the third inlet line fluidly coupled with the inlet port of the ampoule assembly; and
a second end of the third inlet line to be connected to a push gas source; and
a first outlet line comprising:
a first end of the first outlet line fluidly coupled with the outlet port of the ampoule assembly; and
a second end of the first outlet line fluidly coupled with the second end of the first inlet line.

8. The system of claim 7, wherein the second end of the third inlet line is connected to the push gas source and the push gas source comprises a gas selected from helium, nitrogen, argon, or combinations thereof.

9. The system of claim 7, further comprising a liquid flow meter positioned between the first end of the first inlet line and the second end of the first inlet line operable to measure a flow rate of the liquid reactant flown to the injection valve.

10. The system of claim 7, wherein the liquid reactant is selected from silane-containing precursors, tetraethyl orthosilicate (TEOS), or water.

11. The system of claim 7, wherein the carrier gas is selected from helium, nitrogen or argon.

12. The system of claim 7, wherein the processing chamber comprises one or more evaporation crucibles.

* * * * *

UNITED STATES PATENT AND TRADEMARK OFFICE
CERTIFICATE OF CORRECTION

PATENT NO. : 11,180,849 B2
APPLICATION NO. : 16/546170
DATED : November 23, 2021
INVENTOR(S) : Subramanya P. Herle et al.

It is certified that error appears in the above-identified patent and that said Letters Patent is hereby corrected as shown below:

On the Title Page

In item (65), in Column 1, in "Prior Publication Data", Line 2, below "US 2020/0071820 A1 Mar. 5, 2020" insert -- (30) Foreign Application Priority Data
Sep. 3, 2018 (IN) .................... 201841032971 --.

In the Specification

In Column 2, Line 30, delete "infection" and insert -- injection --, therefor.

In Column 4, Lines 36-44, after "substrate." delete "In at least one aspect, the substrate is a plastic substrate, such as, polypropylene and/or polyethylene). In another aspect, the substrate has a film formed thereon, for example, a copper substrate having a lithium film formed 40 thereon. In another aspect, the substrate is a copper substrate or an aluminum substrate. Thus, some implementations of the system described herein reduce thermal heat load, which allows for deposition of thin films on heat sensitive substrates.".

In Column 7, Line 24, delete "$AlO_x$(" and insert -- $AlO_x$ ( --, therefor.

In Column 7, Line 29, delete "$(CaCOa_3)$," and insert -- $(CaCO_3)$, --, therefor.

In Column 11, Line 17, delete "48," and insert -- 4B, --, therefor.

Signed and Sealed this
First Day of March, 2022

Drew Hirshfeld
*Performing the Functions and Duties of the
Under Secretary of Commerce for Intellectual Property and
Director of the United States Patent and Trademark Office*